(12) United States Patent
Furuie

(10) Patent No.: US 10,360,851 B2
(45) Date of Patent: Jul. 23, 2019

(54) DISPLAY DEVICE AND METHOD OF MANUFACTURING THE SAME

(71) Applicant: Japan Display Inc., Tokyo (JP)

(72) Inventor: Masamitsu Furuie, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/685,024

(22) Filed: Aug. 24, 2017

(65) Prior Publication Data

US 2018/0090066 A1    Mar. 29, 2018

(30) Foreign Application Priority Data

Sep. 26, 2016 (JP) .................................. 2016-186693

(51) Int. Cl.
*G09G 3/3233* (2016.01)
*H01L 27/32* (2006.01)

(52) U.S. Cl.
CPC ........ *G09G 3/3233* (2013.01); *H01L 27/3211* (2013.01); *H01L 27/3276* (2013.01); *G09G 2300/0404* (2013.01); *G09G 2310/0264* (2013.01); *H01L 2227/326* (2013.01)

(58) Field of Classification Search
CPC ... G09G 2300/0404; G09G 2310/0264; G09G 3/3233; H01L 2227/326; H01L 27/3211; H01L 27/3276

USPC ........................................................... 257/40
See application file for complete search history.

(56) References Cited

U.S. PATENT DOCUMENTS

| 2004/0188150 | A1* | 9/2004 | Richard | G06F 3/041 |
| | | | | 178/18.01 |
| 2010/0065862 | A1* | 3/2010 | Ray | B82Y 20/00 |
| | | | | 257/88 |
| 2010/0167441 | A1* | 7/2010 | Ray | G09G 3/32 |
| | | | | 438/29 |
| 2014/0092572 | A1* | 4/2014 | Hossain | H05K 1/111 |
| | | | | 361/767 |
| 2017/0338198 | A1* | 11/2017 | Jang | H01L 24/05 |

FOREIGN PATENT DOCUMENTS

JP    2010-8677 A    1/2010

* cited by examiner

*Primary Examiner* — Tony O Davis
(74) *Attorney, Agent, or Firm* — Michael Best & Friedrich LLP

(57) ABSTRACT

A display device includes a first substrate including a conductive particle provided therein; a first line connected with the first substrate on the side of a first surface of the first substrate; a display element connected with the first line; and a second line connected with the first line via the conductive particle on the side of a second surface of the first substrate.

15 Claims, 14 Drawing Sheets

DISPLAY DEVICE AND METHOD OF MANUFACTURING THE SAME

CROSS REFERENCE TO RELATED APPLICATIONS

This application is based upon and claims the benefit of priority from the prior Japanese Patent Application No. 2016-186693, filed on Sep. 26, 2016, the entire contents of which are incorporated herein by reference.

FIELD

The present invention relates to a display device including a plurality of pixels, and specifically to a display device including a light emitting element in each of the plurality of pixels.

BACKGROUND

Conventionally, as a display device usable for a mobile information terminal, a liquid crystal display device and an organic EL (electroluminescence) display device are known. As the information terminal is reduced in size, these display devices are now required to reduce the size of a region other than a display region (so-called peripheral region). Recently, a technology of electrically connecting a line provided on the side of a front surface of a substrate and a line provided on the side of a rear surface of the substrate to each other via an opening formed in the substrate has been developed (Japanese Laid-Open Patent Publication No. 2010-8677).

SUMMARY

A display device in an embodiment according to the present invention includes a first substrate including a conductive particle provided therein; a first line connected with the conductive particle on the side of a first surface of the first substrate; a display element connected with the first line; and a second line connected with the first line via the conductive particle on the side of a second surface of the first substrate.

A display device in an embodiment according to the present invention includes a first substrate including a conductive particle provided therein; a first line connected with the conductive particle on the side of a first surface of the first substrate; a thin film transistor connected with the first line; a display element connected with the thin film transistor; and a second line connected with the first line via the conductive particle on the side of a second surface of the first substrate.

A method for manufacturing a display device in an embodiment according to the present invention includes applying a resin material containing a conductive particle to a support substrate to form a resin layer; etching or polishing the resin film from a first surface thereof to partially expose the conductive particle; forming a first line connected with the conductive particle on the side of the first surface of the resin layer; forming a display element connected with the first line; peeling off the support substrate from the resin layer; etching or polishing the resin layer from a second surface thereof to partially expose the conductive particle; and bonding a substrate including a second line to the second surface of the resin layer to connect the conductive particle and the second line to each other.

A method for manufacturing a display device in an embodiment according to the present invention includes applying a resin material containing a conductive particle to a support substrate to form a resin layer; etching or polishing the resin film from a first surface thereof to partially expose the conductive particle; forming a first line connected with the conductive particle on the side of the first surface of the resin layer; forming a thin film transistor connected with the first line, forming a display element connected with the thin film transistor; peeling off the support substrate from the resin layer; etching or polishing the resin layer from a second surface thereof to partially expose the conductive particle; and bonding a substrate including a second line to the second surface of the resin layer to connect the conductive particle and the second line to each other.

DESCRIPTION OF EMBODIMENTS

Figure 1:
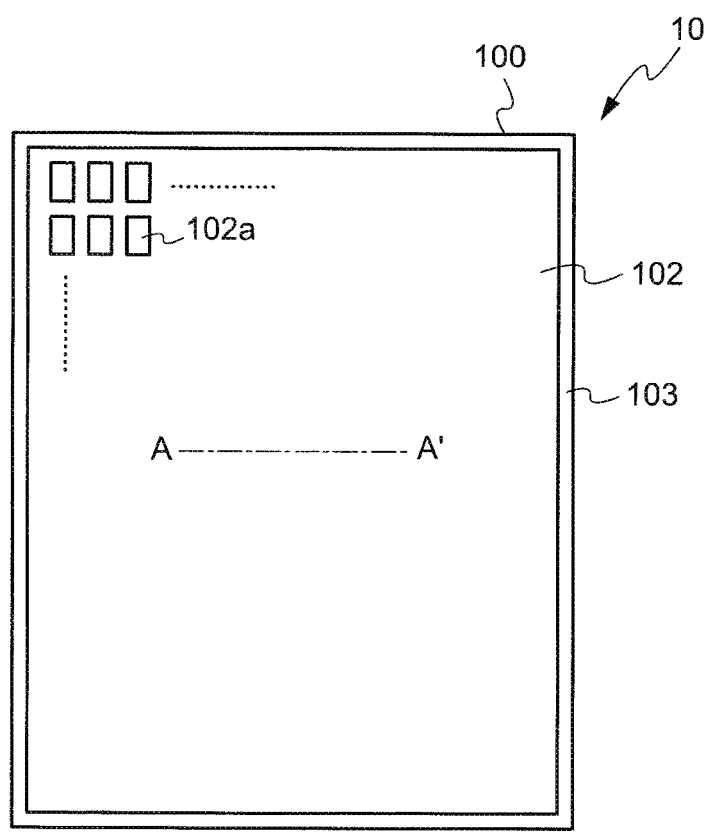
FIG. 1 is a plan view showing an example of schematic structure of a display device in embodiment 1.

As the information terminal is reduced in size, the region other than the display region is needed to be reduced in size, and also the integration degree of pixels (the resolution of the display region) needs to be increased. The technology described in Japanese Laid-Open Patent Publication No. 2010-8677 requires that an opening should be formed at a specific position of the substrate. Therefore, this technology is difficult to be realized due to the influence of the processing precision in a state where the peripheral region is reduced in size and the resolution of the display region is increased.

An object of the present invention is to provide a technology for providing electric connection between the side of a front surface of a substrate and the side of a rear surface of the substrate with certainty.

An object of the present invention is to provide a technology for decreasing an area size of a region other than a display region (i.e., area size of a peripheral region) on the substrate.

Hereinafter, embodiments of the present invention will be described with reference to the drawings and the like. The present invention may be carried out in various forms without departing from the gist thereof, and is not to be construed as being limited to any of the following embodiments.

In the drawings, components may be shown schematically regarding the width, thickness, shape and the like, instead of being shown in accordance with the actual sizes, for the sake of clearer illustration. The drawings are merely examples and do not limit the interpretations of the present invention in any way. In the specification and the drawings, components that have substantially the same functions as those described before with reference to a previous drawing(s) bear the identical reference signs thereto, and detailed descriptions thereof may be omitted.

In the specification and the claims, an expression that a component is "on" another component encompasses a case where such a component is in contact with the another component and also a case where such a component is above or below the another component, namely, a case where still another component is provided between such a component and the another component, unless otherwise specified. The terms "on", "above" and "below" are used to describe relative positions of elements. Therefore, the relative positions represented by the terms "on", "above" and "below" may be different in the case where a different element is provided as the element based on which the terms "on", "above" and "below" are used.

In the specification and the claims, the term "connection" refers to direct connection between conductive elements (physical connection without any other conductive element) and also refers to indirect connection (electric connection via another conductive element).

In the specification and the claims, the term "display device" refers to a device including a display element. The "display element" is an element displaying an image. A display element is, for example, a light emitting element using a light emitting material that emits light when being supplied with an electric field (e.g., organic EL element), a liquid crystal element using a liquid crystal material, an electrophoretic element using electrophoresis of charged particles, or the like. An optical element such as the light emitting element, the liquid crystal element, the electrophoretic element or the like operates when an electric field is applied to a material layer held between electrodes. In the specification and the claims, the material layer used for such an optical element may be referred to as an "electrooptical layer".

Embodiment 1

<Structure of the Display Device>

In this embodiment, an organic EL display device will be described as an example of display device 10. FIG. 1 is a plan view showing a schematic structure of the display device 10. The display device 10 includes a substrate 100, a display region 102 including a plurality of pixels 102a, and a peripheral region 103 surrounding the display region 102. The display region 102 and the peripheral region 103 are provided on the substrate 100. As described below, the substrate 100 has a stack structure including a first substrate 101 and a second substrate 201.

The display region 102 is a region displaying an image. The pixels 102a located in the display device 102 each act as a light emitting region. Namely, an assembly of the plurality of pixels 102a acts as the display region 102. Each of the pixels 102a includes a pixel circuit described below with reference to FIG. 4. The pixel circuit includes a thin film transistor 301, a capacitor 303 and a thin film transistor 30. In this embodiment, the level of an electric current flowing in the thin film transistor 30 included in each pixel 102a is controlled to control the light emitting element included in the corresponding pixel 102a.

The peripheral region 103 is a region of the substrate 100 that is not used as the display region 102. Specifically, the peripheral region 103 is used to provide a designing process margin or to provide a space for lines. Generally, a driving circuit supplying a signal to the display region 102 is located in the peripheral region.

The display device 10 in this embodiment may include a circuit substrate, including a part of the driving circuit or the pixel circuit, in a region that overlaps the plurality of pixels 102a as seen in a plan view. Therefore, substantially the entirety of the substrate 100 is usable as the display region 102. Namely, the peripheral region 103 in the display device 10 in this embodiment has a reduced area size.

Figure 2:
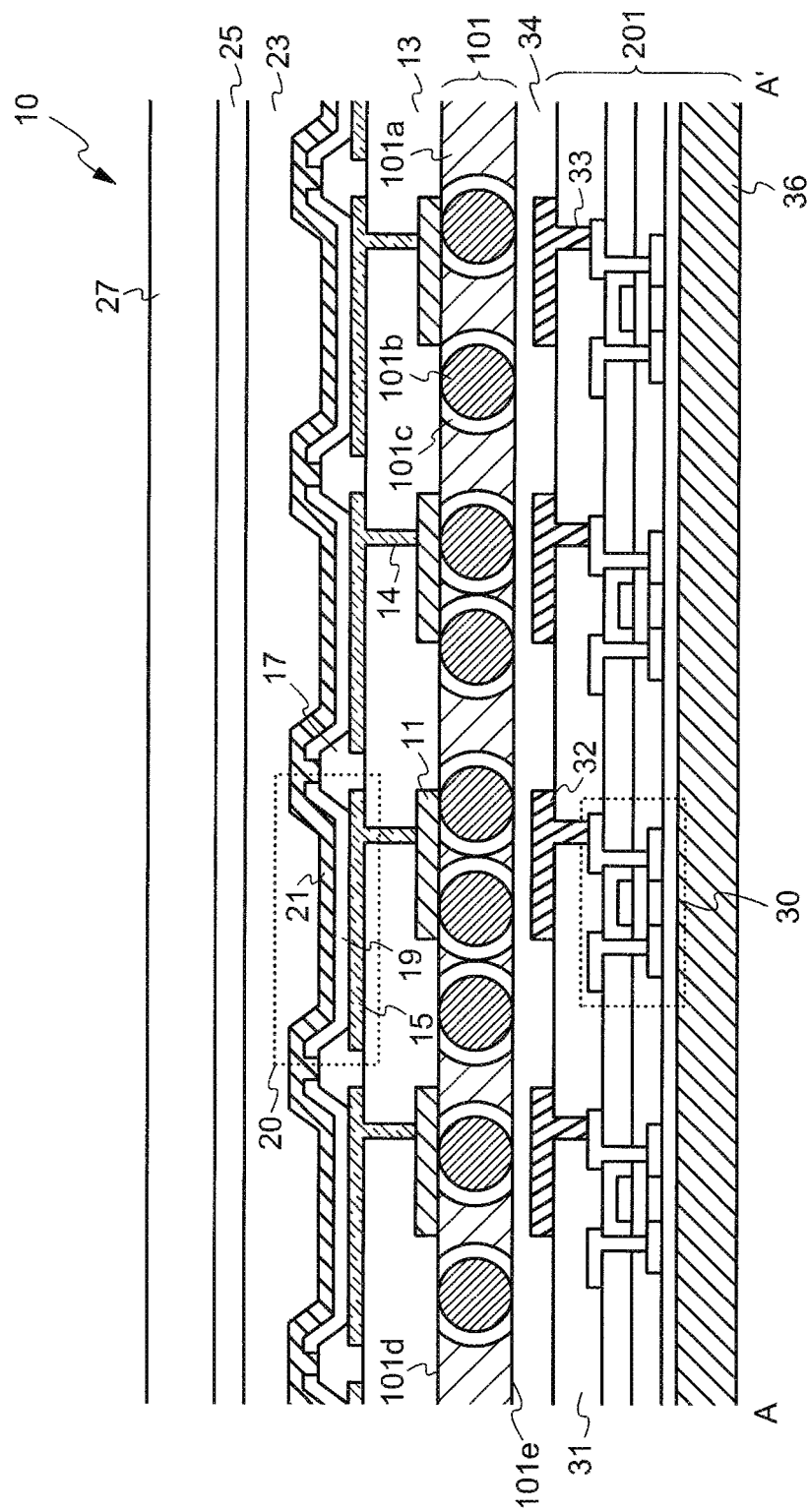
FIG. 2 is a cross-sectional view showing an example of schematic structure of the display device in embodiment 1.

FIG. 2 is a cross-sectional view showing a schematic structure of the display device 10. Specifically, FIG. 2 shows the display device 10 taken along one-dot chain line A-A' in FIG. 1. In the display device 10 in this embodiment, the first substrate 101 provided in a part of the substrate 100 includes a resin film 101a, conductive particles 101b, and resin portions 101c.

As shown in FIG. 2, the first substrate 101 includes the conductive particles 101b provided in the resin film 101a, which is formed of a resin material. The conductive particles 101b are exposed at a first surface 101d of the first substrate 101 (surface on which a light emitting element described below is to be provided) and at a second surface 101e of the first substrate 101 (surface opposite to the surface 101d). With such a structure, a conductor located on the side of the first surface 101d of the first substrate 101 and a conductor located on the side of the second surface 101e of the first substrate 101 are connectable with each other via the conductive particles 101b. The conductive particles 101b are partially covered with the resin elements 101c, and therefore, adjacent conductive particles 101b are insulated from each other. With such an arrangement, a structural body including each conductive particle 101b and each resin element 101c is treated as a conductor having anisotropy.

A resin material used to form the resin film 101a may be, for example, polyimide. The resin material is not limited to polyimide, and the resin film 101a may be formed of any resin material withstanding the temperature used to form an element located on the side of the first surface 101d of the first substrate 101 (e.g., to form a line or the like).

The conductive particles 101b may be formed of a conductive material withstanding the temperature used to form an element located on the side of the first surface 101d of the first substrate 101 (e.g., to form a line or the like). The conductive particles 101b may be formed of metal particles of a material having a melting point of 600° C. or higher, for example, gold (Au), silver (Ag), magnesium (Mg), platinum (Pt), aluminum (Al) or the like.

The size (typically, diameter) of the conductive particles 101b may be selected in consideration of the thickness of the first substrate 101. Specifically, it is desirable that the size (e.g., diameter) of the conductive particles 101b is selected so as to be substantially equal to the final thickness of the resin film 101a.

The resin elements 101c covering the resin particles 101b may be formed of a resin material used to form the resin film 101a, or a different resin material. Specifically, the resin elements 101c may be formed of a resin material withstanding the temperature, the etchant, or the etching gas used to form an element located on the side of the first surface 101d of the first substrate 101 (e.g., to form a line or the like). The resin elements 101c have a role of giving anisotropy to the conductive particles 101b in the resin film 101a. Namely, the resin elements 101c have a role of preventing the anisotropy from being extinguished due to the cohesion of the conductive particles 101b in the resin film 101a.

The structural body including the conductive particle 101b and the resin element 101c as shown in FIG. 2 may be formed as follows, for example. A metal particle as described above is immersed in a resin material such as polyimide or the like, and is sintered at a temperature of about 200° C. The method for forming the structural body is not limited to this. For example, a resin material may be sprayed to the metal particle by use of a spray device, and then the resin material may be sintered.

A plurality of first lines 11 are provided on the side of the first surface 101d of the first substrate 101, at positions corresponding to the plurality of pixels 102a shown in FIG. 1. The first lines 11 are connected with the conductive particles 101b on the side of the first surface 101d of the first substrate 101. In the example shown in FIG. 2, the conductive particles 101b and the first lines 11 are directly connected with each other. Alternatively, for example, the conductive particles 101b and the first lines 11 may be indirectly connected with each other via an anisotropic conductive film (ACF). The first lines 11 may be formed of a known conductive material.

The plurality of first lines 11 are covered with an insulating film 13 formed of a resin material. The insulating film 13 is not limited to being formed of a resin material, and may be formed of an inorganic insulating material such as silicon oxide or the like.

A plurality of pixel electrodes 15 are provided on the insulating film 13. The pixel electrodes 15 are respectively connected with the first lines 11 via contact holes 14. The pixel electrodes 15 are formed as follows. A transparent conductive film and a metal film are stacked on each other, and the stacked films are processed by photolithography. In this embodiment, the pixel electrodes 15 each have a stack structure including a silver film and ITO (Indium Tin Oxide) films sandwiching the silver film. The plurality of pixel electrodes 15 are each rectangular as seen in a plan view, and are arrayed in a plurality of rows and a plurality of columns.

Edges of the plurality of pixel electrodes 15 are each covered with an insulating film 17. The insulating film 17 is usually referred to as a bank or a rib. The edges of the pixel electrodes 15 are covered with the insulating films 17, and thus light emitting regions (regions where the pixel electrodes 15 are exposed) are defined.

Organic EL films 19 are respectively provided on the pixel electrodes 15. The organic EL films 19 each emit light of a predetermined color. In actuality, the organic EL films 19 emitting light of red, green and blue are respectively provided in the pixels corresponding to red, green and blue. The organic EL films 19 merely need to include a light emitting layer, and may include an electron injection layer, an electron transfer layer, a hole injection layer or a hole transfer layer.

A common electrode 21 common to all the pixels are provided on the organic EL films 19. The common electrode 21 may be formed of a metal film containing an alkaline metal material. In this embodiment, the common electrode 21 is formed of a film of MgAg (alloy of magnesium and silver). The metal material used to form the common electrode 21 is not limited to this. In this embodiment, light is output after being transmitting through the common electrode 21. Therefore, the common electrode 21 has such a thickness as to transmit visible light.

A structural body including the pixel electrode 15, the organic EL film 19 and the common electrode 21 is referred to as a light emitting element 20. In the light emitting element 20, the pixel electrode 15 acts as an anode, and the common electrode 21 acts as a cathode. As can be seen, in the display device 10 in this embodiment, the light emitting elements 20 as display elements are respectively connected with the first lines 11 on the side of the first surface 101d of the first substrate 101.

A sealing film 23 is provided on the light emitting elements 20. The sealing film 23 has a role of preventing entrance of moisture or oxygen from outside and thus suppressing deterioration of the light emitting elements 20. There is no specific limitation on the structure of the sealing film 23. In this embodiment, the sealing film 23 has a stack structure including a resin film of an acrylic resin or the like and silicon nitride films sandwiching the resin film.

A cover member 27 is provided on the sealing film 23 with an adhesive layer being provided between the cover member 27 and the sealing film 23. The cover member 27 may be merely a protective film or may be a member included in a touch panel. The protective film may be formed of, for example, polyethyleneterephthalate (PET), cycloolefin polymer (COP), cycloolefin copolymer (COC) or the like.

As described above, the first lines 11 and the light emitting elements 20 connected with the first lines 11 are basically located on the side of the first surface 101d of the first substrate 101. Namely, unlike in the conventional display device, a thin film transistor controlling the light emitting element 20 is not located on the side of the first surface 101d of the first substrate 101.

Instead, in the display 10 in this embodiment, a plurality of thin film transistors 30 controlling the light emitting elements 20, and a plurality of second lines 32 respectively connected with the plurality of thin film transistors 30, are included in the second substrate 201. The second substrate 201 is bonded to the second surface 101e of the first substrate 101 with an anisotropic conductive film 34. The plurality of second lines 32 and the conductive particles 101b are connected with each other via the anisotropic conductive film 34.

The second substrate 201 includes a substrate 36, and the plurality of thin film transistors 30 and the plurality of second lines 32 provided on the substrate 36. The substrate 36 includes a group of lines supplying a signal to the thin film transistors 30, and includes a terminal portion 40 to which a signal is input from an external circuit (not shown). The substrate 36 may be a flexible substrate such as a resin substrate or the like, or a hard substrate such as a ceramic substrate, a glass epoxy substrate or the like.

The second lines 32 are provided on an insulating film 31 covering the thin film transistors 30. The second lines 32 and the thin film transistors 30 are respectively connected with each other via contact holes 33 provided in the insulating film 31. The insulating film 31 may be formed of, for example, a resin material.

Figure 3:
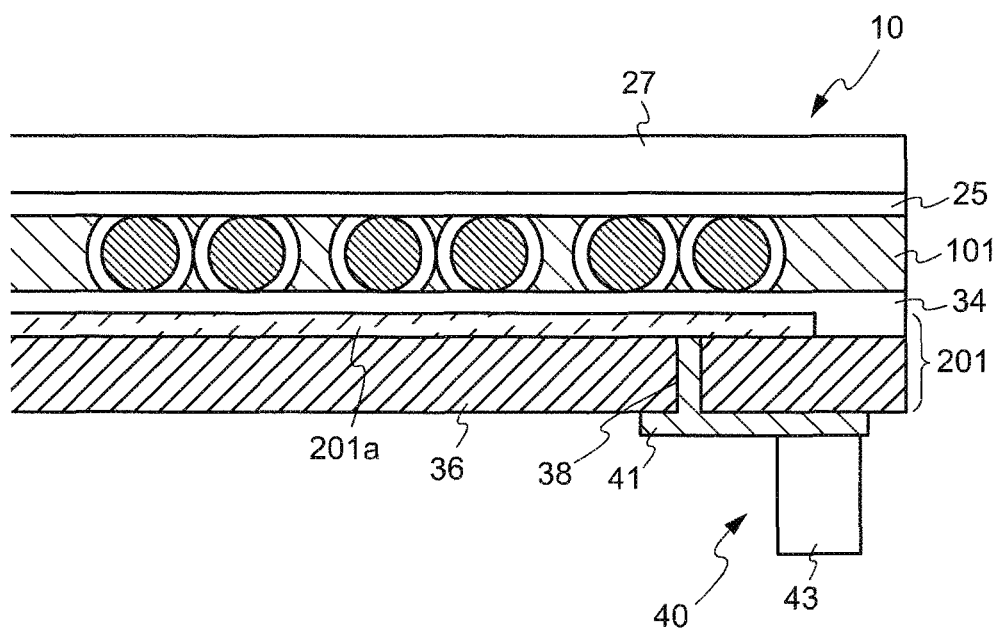
FIG. 3 is a cross-sectional view showing an example of structure of a terminal portion of the display device in embodiment 1.

FIG. 3 is a cross-sectional view showing a structure of the terminal portion 40 of the display device 10. As shown in FIG. 3, the terminal portion 40 includes a terminal electrode 41 and a connector 43. The terminal electrode 41 is connected with a line 201a included in the second substrate 201. The line 201a and the terminal electrode 41 are connected with each other via a through-hole 38 provided in the substrate 36. The connector 43 is a member that bonds input terminals supplying a signal from an external circuit (not shown).

As can be seen, in the display device 10 in this embodiment, the terminal portion 40 is located at a position overlapping the first substrate 10 as seen in a plan view. Therefore, there is no need to provide a region other than the display device 102 in order to located the terminal portion 40.

Figure 4:
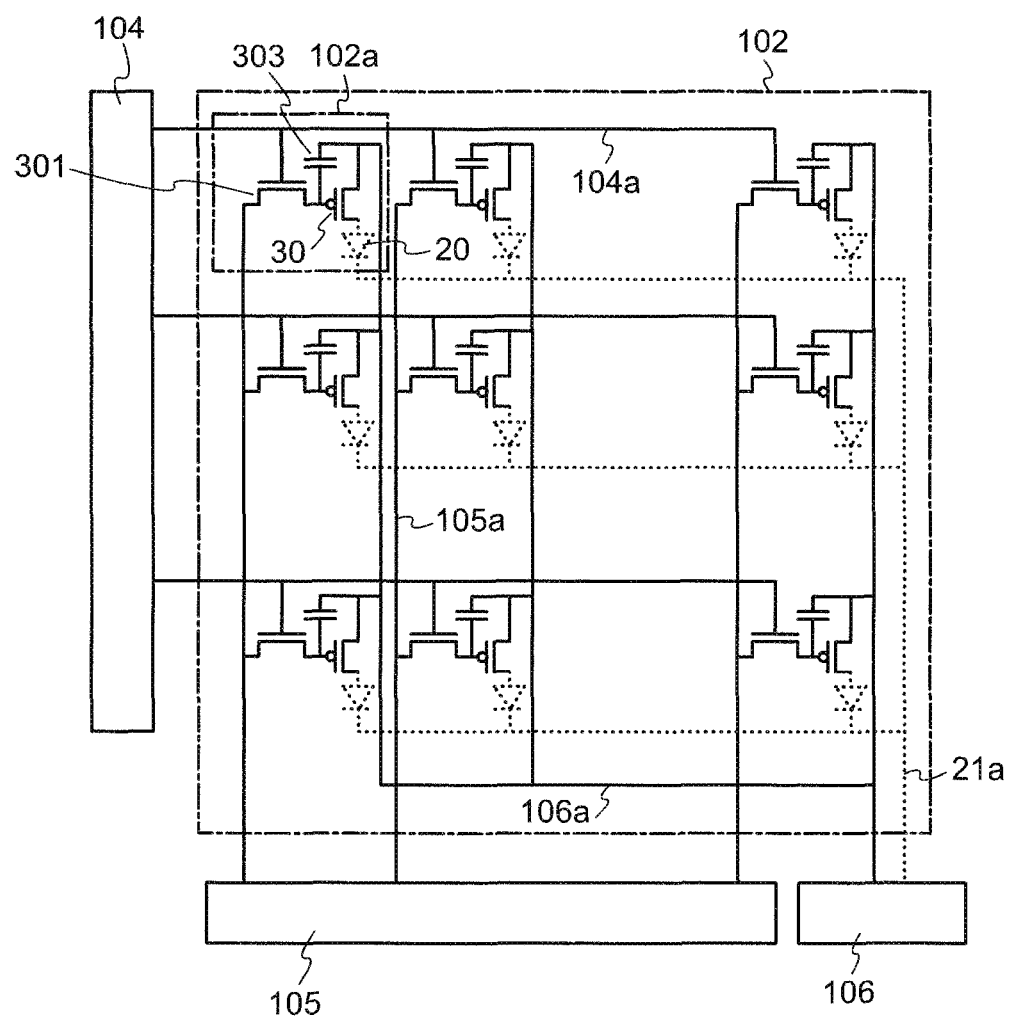
FIG. 4 is an electric equivalent circuit diagram of the display device in embodiment 1.

Now, a circuit configuration of the display region 102 in the display device 10 will be described. FIG. 4 is an electric equivalent circuit diagram of the display device 10. As shown in FIG. 4, the display region 102 includes the plurality of pixels 102a each including a pixel circuit. In this embodiment, each pixel 102a includes the thin film transistor 301 as a switching element, the thin film transistor 30 as a current control element, the capacitor 303 and the light emitting element 20. The configuration of the pixel circuit is merely an example, and the pixel circuit may have another configuration.

Signals are supplied to the display region 102 via a scanning line driving circuit 104, a data line driving circuit 105 and a light emission power supply 106. A scanning signal output from the scanning line driving circuit 104 is input to a gate of the thin film transistor 301 via a scanning line 104a. A data signal output from the data line driving circuit 105 is input to a source of the thin film transistor 301 via a data line 105a. A power supply signal output from the light emission power supply 106 is input to a source of the thin film transistor 30 and a first electrode of the capacitor 303 via a power supply line 106a.

Driving circuits such as the scanning line driving circuit 104 and the data line driving circuit 105 may be formed of a thin film transistor provided on a substrate or may be formed of an integrated circuit such as an IC chip or the like.

The data signal input to the source of the thin film transistor 301 is input to a second electrode of the capacitor 30 at a timing when the thin film transistor 301 is turned on. At the same time, the data signal is input to a gate of the thin film transistor 30. Then, at a timing when the thin film transistor 301 is turned off, the thin film transistor 30 is turned on. At this point, a current corresponding to the data signal input to the gate of the thin film transistor 30 flows between the source and a drain of the thin film transistor 30. This current is supplied to the light emitting element 20, and thus light of a desired color is provided.

As described above, the display device 10 in this embodiment includes the light emitting elements 20 on the side of the first surface 101d of the first substrate 100, and includes the thin film transistors 30 on the side of the second surface 101e of the first substrate 100. Namely, with the equivalent circuit shown in FIG. 4, the light emitting element 20 and a common line 21a represented with the dotted line are provided on the side of the first surface 101d of the first substrate 101, and the other elements represented with the solid line (the scanning line driving circuit 104, the data line driving circuit 105, the light emission power supply 106, the thin film transistors 301, the thin film transistors 30, the capacitors 303, the scanning lines 104a, the data lines 105a, and the power supply lines 106a) are provided on the side of the second surface 101e of the first substrate 100. Specifically, the above-mentioned other elements are included in the second substrate 201.

<Method for Manufacturing the Display Device>

Now, a method for manufacturing the display device 10 in this embodiment will be described with reference to FIG. 5 to FIG. 12. FIG. 5 to FIG. 12 are each a cross-sectional view showing the method for manufacturing the display device 10 in this embodiment.

Figure 5:
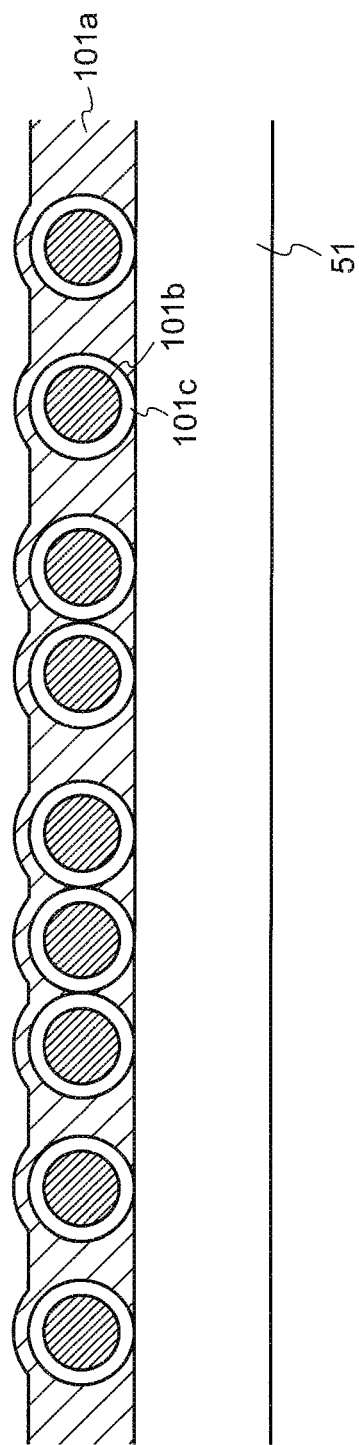
FIG. 5 is a cross-sectional view showing an example of step of a method for manufacturing the display device in embodiment 1.

First, as shown in FIG. 5, the resin film 101a having the structural bodies, each including the conductive particle 101b and the resin element 101c, dispersed therein is formed on a support substrate 51. In this embodiment, a resin material having the structural bodies, each including the conductive particle 101b and the resin element 101c, dispersed therein is applied to the support substrate 51 by spin-coating or the like, and is sintered to form the resin film 101a.

Figure 6:
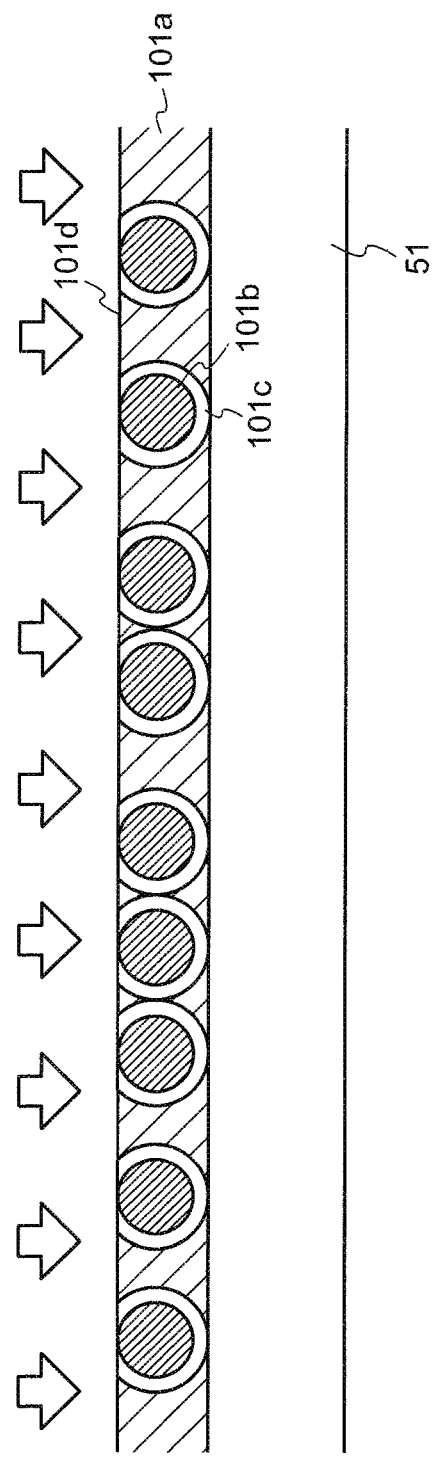
FIG. 6 is a cross-sectional view showing an example of step of the method for manufacturing the display device in embodiment 1.

Next, as shown in FIG. 6, the resin film 101a is etched or polished from the first surface 101d to remove a part of the resin film 101a. The removal of the part of the resin film 101a is performed until the conductive particles 101b are exposed. Namely, in the step of removing the resin film 101a, the resin elements 101c covering the conductive particles 101b are also partially removed.

In the case where the resin film 101a is etched, an ashing process using, for example, oxygen plasma (also referred to as a plasma ashing process) may be performed. In the case where the resin film 101a is polished, CMP (chemical mechanical polishing) may be performed. In this embodiment, an ashing process using oxygen plasma is performed to remove a surface region and the vicinity thereof of the resin film 101a and thus to partially expose the conductive particles 101b.

Figure 7:
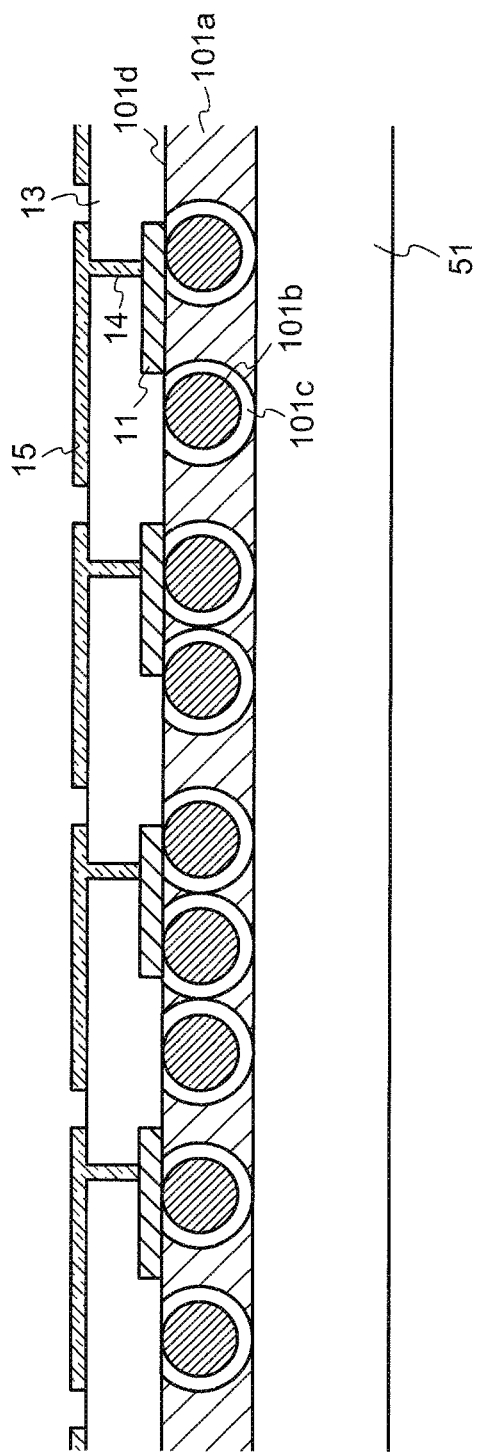
FIG. 7 is a cross-sectional view showing an example of step of the method for manufacturing the display device in embodiment 1.

Next, as shown in FIG. 7, the first lines 11 are formed on the first surface 101d of the resin film 101a at which the conductive particles 101b are exposed. The first lines 11 are formed as follows. A metal layer is formed of a known metal material and then is patterned by photolithography. Since the conductive particles 101b dispersed in the resin film 101a have been exposed at the first surface 101d of the resin film 101a, the first lines 11 are each connected with one of the conductive particles 101b.

After the first lines 11 are formed, the insulating film 13 is formed to cover the first lines 11. In this embodiment, the insulating film 13 is formed of a photosensitive acrylic resin material. The insulating film 13 flattens the roughness caused by the first lines 11. In preparation of forming the pixel electrodes 15 in the next step, the contact holes 14 are formed in the first lines 11 at this point.

After the insulating film 13 is formed, the pixel electrodes 15 are formed of a transparent conductive film and a metal film. In this embodiment, a stack structure including a silver film and ITO films sandwiching the silver film is formed, and then is patterned to form the plurality of pixel electrodes 15. At this point, the pixel electrodes 15 are respectively connected with the first lines 11 via the contact holes 14 formed in the insulating film 13 in advance. The pixel electrodes 15 are located in positional correspondence with the pixels 102a shown in FIG. 1. Therefore, the pixel electrodes 15 are arrayed in a matrix.

Figure 8:
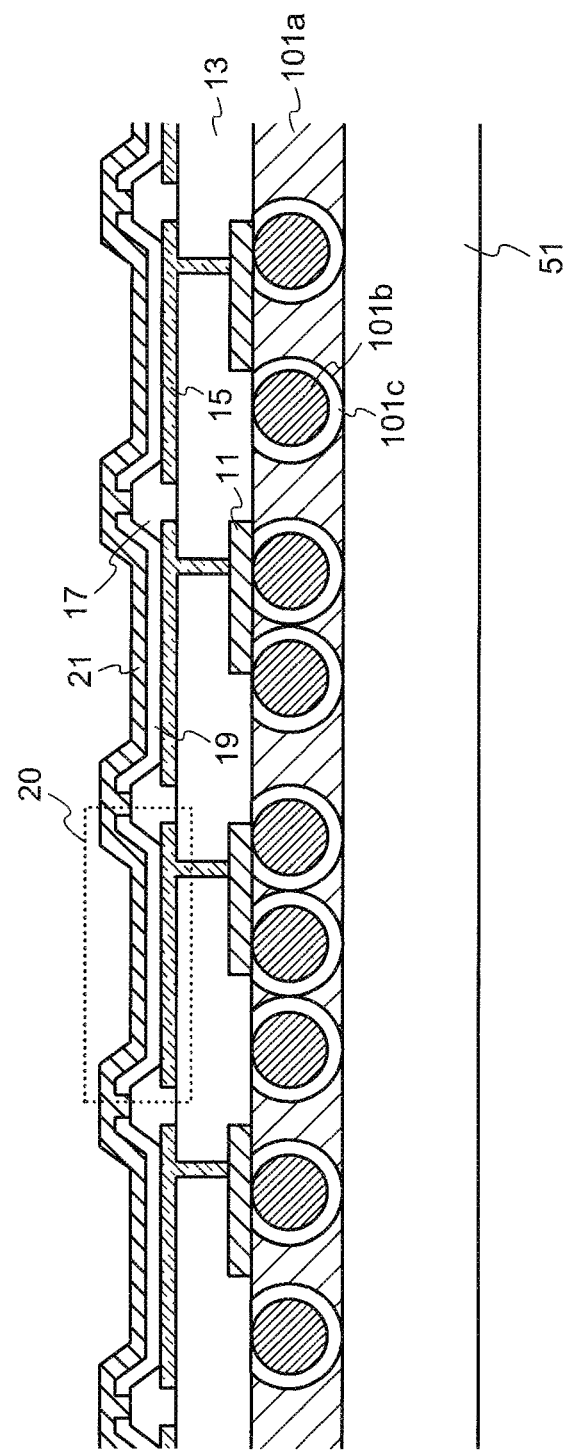
FIG. 8 is a cross-sectional view showing an example of step of the method for manufacturing the display device in embodiment 1.

Next, as shown in FIG. 8, the insulating films 17 are formed of a resin material as banks, so as to cover the edges of the pixel electrodes 15. The insulating films 17 may be formed as follows, for example. A resin material is applied to cover all the pixel electrodes 15, and then is partially removed to expose a part of each of the pixel electrodes 15. The insulating films 17 are formed to cover the edges of the pixel electrodes 15, and therefore, are arrayed in a lattice as seen in a plan view.

After the insulating films 17 are formed. the organic EL films 19 are formed by vacuum vapor deposition using a metal mask (not shown). The organic EL films 19 are selectively formed for the respective pixels via openings formed in the metal mask. Among the organic materials used to form the organic EL films 19, the light emitting material is provided for each pixel, whereas a carrier transfer material or the like may be provided commonly for all the pixels. In this embodiment, three different organic materials respectively emitting red, green and blue light are used as the light emitting materials.

After the organic EL films 19 are formed, the common electrode 21 acting as a cathode is formed. It is desirable that the common electrode 21 is formed without exposing the organic EL films 19 to the air because the organic EL films 19 are vulnerable against moisture. In this embodiment, the common electrode 21 is formed of MgAg by vapor deposition.

After the step shown in FIG. 8, the light emitting elements 20 including the pixel electrodes 15, the organic EL films 19 and the common electrode 21 are formed.

Figure 9:
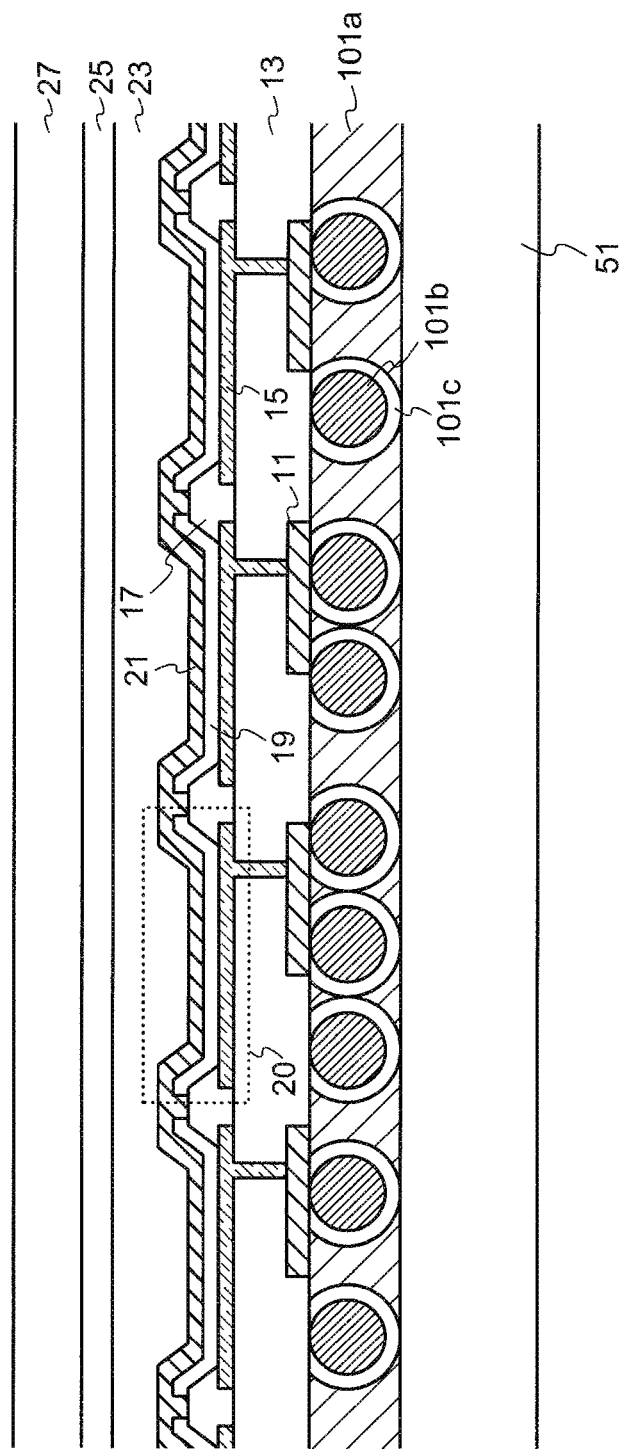
FIG. 9 is a cross-sectional view showing an example of step of the method for manufacturing the display device in embodiment 1.

Next, as shown in FIG. 9, the light emitting elements 20 are covered with the sealing film 23. The sealing film 23 is provided to protect the light emitting elements 20 against an external environment. Therefore, it is preferable that the sealing film 23 is formed of a material having a high blocking effect against moisture and oxygen. In this embodiment, the sealing film 23 is formed of a stack structure including a resin film and silicon nitride films sandwiching the resin film. The sealing film 23 is not limited to being formed of such materials.

As described above, the organic EL films 19 are vulnerable against moisture. The alkaline metal material used for the common electrode 21 is easily oxidized by oxygen or the like. Therefore, it is desirable that after the organic EL films 19 and the common electrode 21 are formed without being exposed to the air, the silicon nitride film is formed continuously without exposing the organic EL films 19 and the common electrode 21 to the air. The steps from the formation of the organic EL films 19 to the formation of the silicon nitride film (a part of the sealing film 23) are continuously performed with no exposure to the air in this manner. Therefore, the deterioration of the organic EL films 19 and the common electrode 21 is suppressed.

After the sealing film 23 is formed as described above, the cover member 27 is bonded to the sealing film 23 with an adhesive layer 25. In this embodiment, the cover member 27 is a resin substrate formed of PET (polyethyleneterephthalate) or the like. Alternatively, the cover member 27 may be a substrate of any other material.

Figure 10:
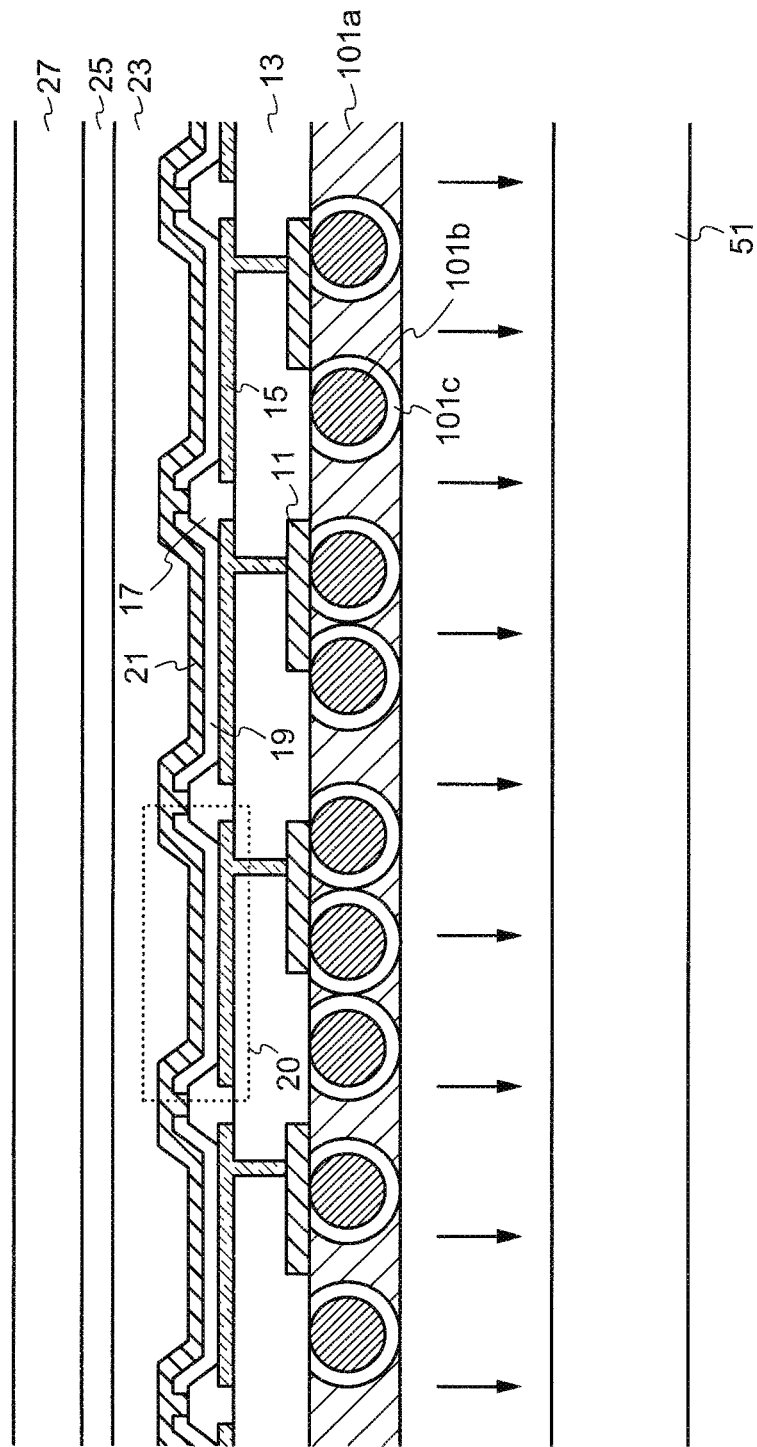
FIG. 10 is a cross-sectional view showing an example of step of the method for manufacturing the display device in embodiment 1.

Next, as shown in FIG. 10, the support substrate 51 is peeled off from the second surface 101e of the resin film 101a. The support substrate 51 may be peeled off by irradiating, with laser light, the interface between the support substrate 51 and the resin film 101a to denature a part of the resin film 101a. The technology used here for peeling by use of laser light is known and thus will not be described in detail.

Figure 11:
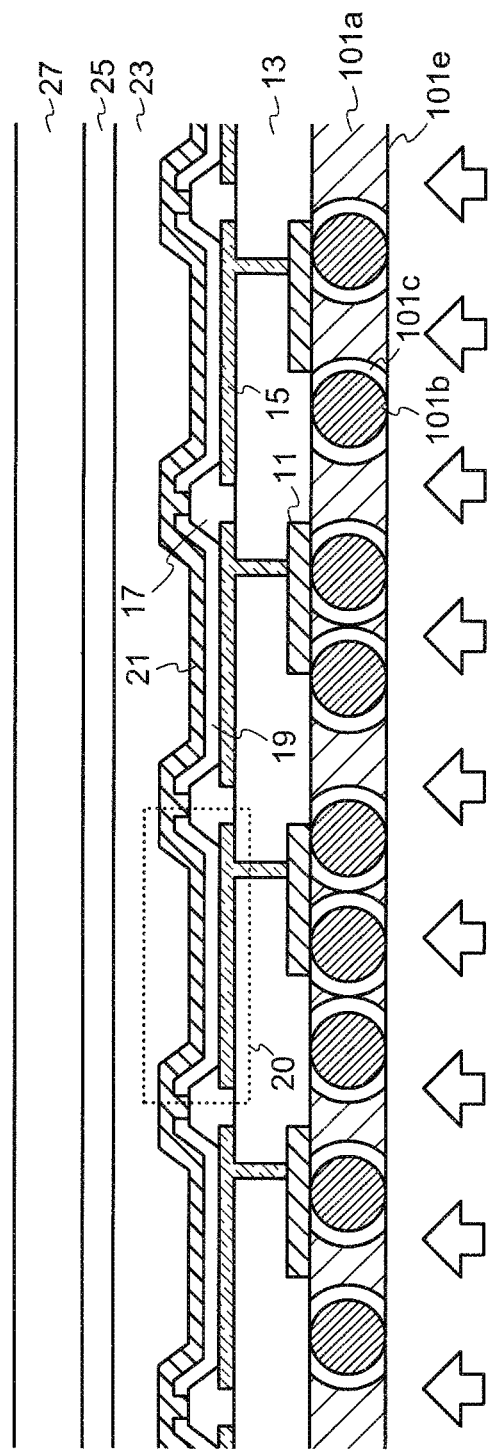
FIG. 11 is a cross-sectional view showing an example of step of the method for manufacturing the display device in embodiment 1.

After the support substrate 51 is peeled off, as shown in FIG. 11, the resin film 101a is etched or polished from the second surface 101e to partially remove the resin film 101a. This process is substantially the same as the above-described process performed on the first surface 101e of the resin film 101a (see FIG. 6). The removal of the part of the resin film 101a is performed until the conductive particles 101b are exposed. The resin elements 101c are also partially removed. In this step also, an ashing process using oxygen plasma is performed to remove a surface region and the vicinity thereof of the resin film 101a and thus to partially expose the conductive particles 101b.

The structural body including the resin film 101a, the conductive particles 101b and the resin elements 101c obtained at this point correspond to the first substrate 101 shown in FIG. 2. As can be seen, an etching process or a polishing process is performed from both of the first surface 101d and the second surface 101e, and thus the final thickness of the etching the resin film 101a is determined. It is desirable that in the state where the final thickness of the resin film 101a is obtained, the conductive particles 101b are at least partially exposed at the first surface 101d and the second surface 101e.

Therefore, it is desirable that the size (e.g., diameter) of the conductive particles 101b is determined so as to be substantially equal (namely, determined so as to be in a range considered to be equal) to the final thickness of the resin film 101a.

Figure 12:
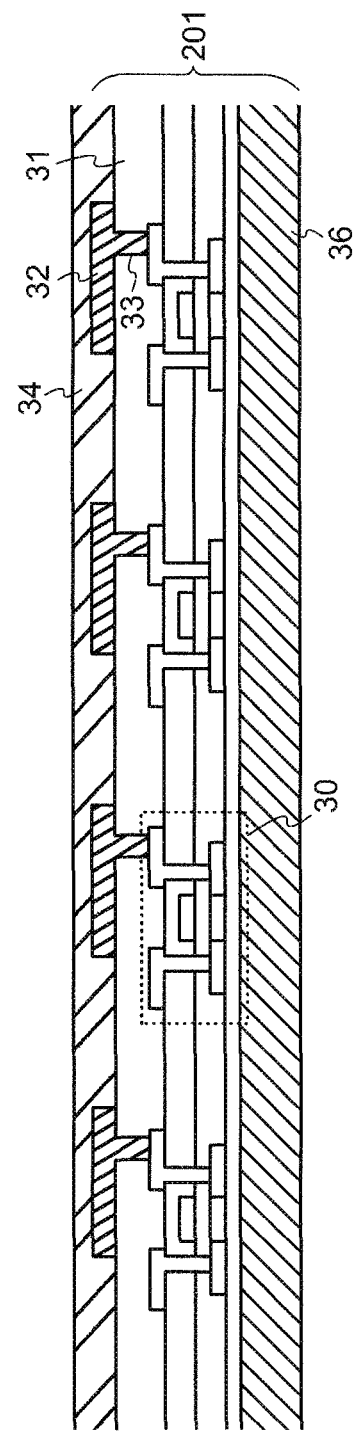
FIG. 12 is a cross-sectional view showing an example of step of the method for manufacturing the display device in embodiment 1.

Next, the second substrate 102 shown in FIG. 12 is prepared. In this embodiment, the plurality of thin film transistors 30 and the plurality of second lines 32 are provided on the substrate 36, and this assembly is prepared as the second substrate 201.

The substrate 36 is a circuit substrate including lines, passive elements or the like provided therein. The thin film transistors 30 may be formed on the substrate 36 by a known technology. The lines or the like provided on the substrate 36 and the thin film transistors 30 may be respectively connected with each other via contact holes formed in an insulating film (e.g., underlying film) located between the lines or the like and the thin film transistors 30. The second lines 32 are respectively connected with the thin film transistors 30 via the contact holes 33 provided in the insulating film 31 covering the thin film transistors 30.

In a final step, the anisotropic conductive film 34 is formed to cover the second lines 32, and the second substrate 201 is bonded to the second surface 101e of the resin film 101a. In this embodiment, the second substrate 201 is bonded to the resin film 101a with the anisotropic conductive film 34. The second substrate 201 and the resin film 101a are not limited to being bonded to each other with the anisotropic conductive film 34, and may be bonded by any other method that uses a material having anisotropic conductivity. As a result of performing the above-described steps, the display device 10 having the stack structure shown in FIG. 2 is manufactured.

The display device 10 in this embodiment uses, as the first substrate 101, the resin film 101a having the conductive particles 101b, partially covered with the resin elements 101c, dispersed therein. The conductive particles 101b are exposed at the front surface (first surface 101d) and at the rear surface (second surface 101e) of the resin film 101a, and are insulated from each other by the resin elements 101c in the resin film 101a. Therefore, in this embodiment, the anisotropy conductors are dispersed in the resin film 101a, so that the front surface and the rear surface of the first substrate 101 are electrically connected with each other with certainty.

In the display device 10 in this embodiment, the first lines 11 and the light emitting elements 20 connected with the first lines 11 are provided on the first substrate 101, and the second lines 32 and the thin film transistors 30 connected with the second lines 32 are provided in the second substrate 201. The first substrate 101 and the second substrate 201 are bonded together, and thus the first lines 11 and the second lines 32 are connected with each other via the conductive particles 101b included in the first substrate 101.

Therefore, the first substrate 101 merely needs to have a space in which the light emitting elements 20 are located, and does not need to have a region other than the display region 102. Namely, as shown in FIG. 1, in this embodiment, the region other than the display region 102 is minimized, and thus the area size of the peripheral region 103 is reduced.

The terminal portion 40 required to receive a signal from an external circuit does not need to be provided on the same side as the display region 102, namely, on the side of the first surface 101d of the first substrate 101. Specifically, the terminal portion 40 may be located on a rear surface of the second substrate 201 (surface not visible from an observer). For this reason also, the area size of the peripheral region 103 is reduced.

Embodiment 2

In embodiment 1, the thin film transistors 30 are provided in the second substrate 201, not in the first substrate 101. Alternatively, the thin film transistors 30 may be provided on the side of the first surface 101d of the first substrate 101. In embodiment 2, the thin film transistors 30 and the light emitting elements 20 are both provided on the side of the first surface 101d of the first substrate 101. In this embodiment, the difference in the structure from the display device 10 in embodiment 1 will be mainly described, and elements same as those of embodiment 1 will bear the same reference signs and descriptions thereof may be omitted.

Figure 13:
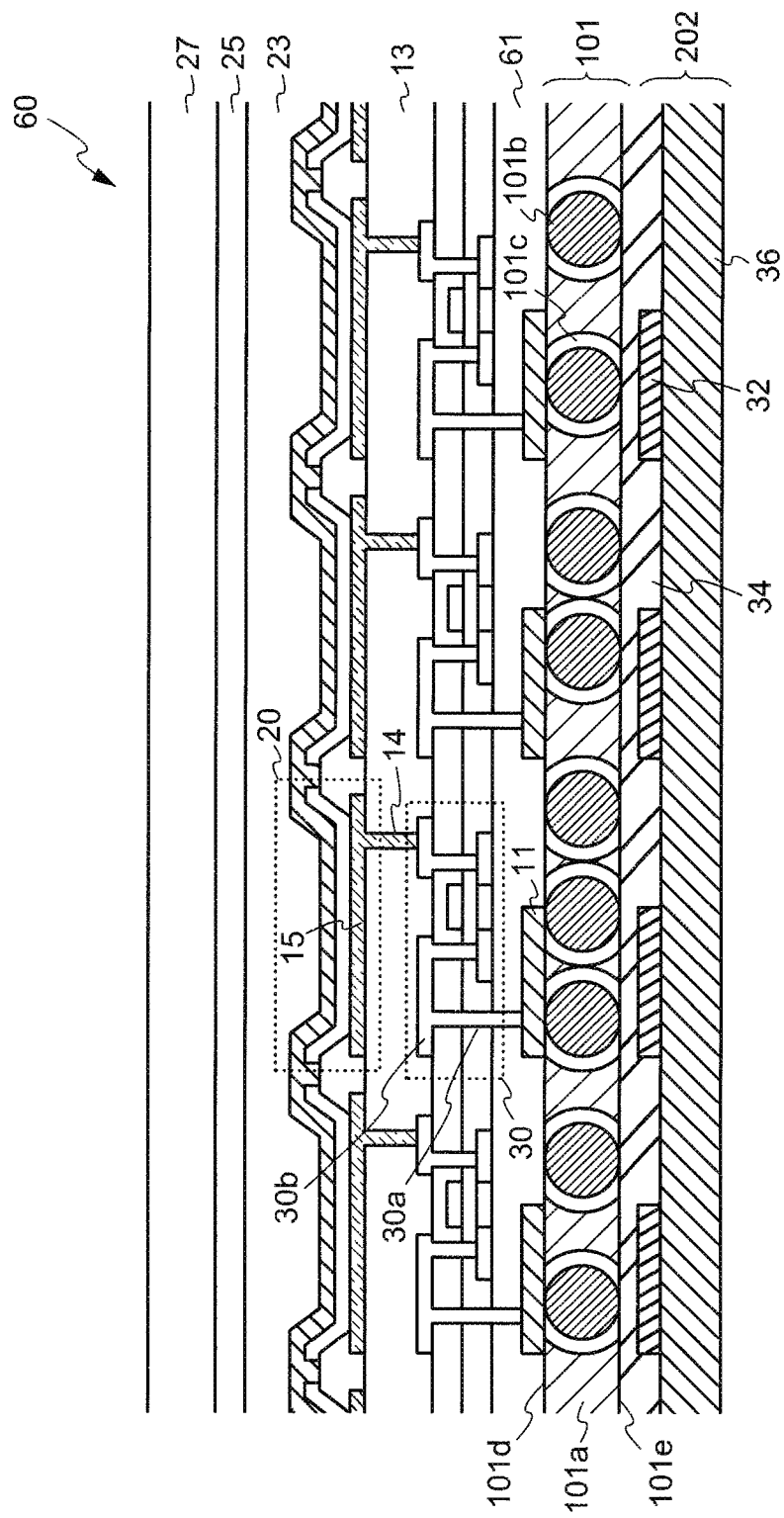
FIG. 13 is a cross-sectional view showing an example of schematic structure of a display device in embodiment 2.

FIG. 13 is a cross-sectional view showing a schematic structure of a display device 60 in embodiment 2. Specifically, FIG. 13 is a cross-sectional view of a part of the display region 102.

As shown in FIG. 13, the first lines 11 respectively connected with the conductive particles 101b are provided on the first substrate 101 (specifically, on the first surface 101d of the first substrate 101). The thin film transistors 30 are provided on the first lines 101 with an insulating film 61 being provided between the thin film transistors 30 and the first lines 101. The thin film transistors 30 may be formed by a known technology. It is necessary that the thin film transistors 30 should be formed at a temperature not exceeding the temperature that the resin film 102a included in the first substrate 101 withstands.

The insulating film 61 may be formed of an inorganic insulating material such as silicon oxide, silicon nitride or the like, or an organic insulating material such as a resin material or the like. In this embodiment, the insulating film 61 is formed of silicon oxide so as to act as an underlying layer for forming the thin film transistors 30.

The first lines 11a are respectively connected with the thin film transistors 30 via contact holes 30a. For example, the first lines 11 may be respectively connected with source electrodes 30b of the thin film transistors 30. In this embodiment, the first lines 11 and the source electrodes 30b are connected with each other. The present invention is not limited to such a structure, and the first lines 11 may be connected with either the source electrodes 30b or drain electrodes of the thin film transistors 30.

The light emitting elements 20 are provided on the thin film transistors 30 with the insulating film 13 being provided between the light emitting elements 20 and the thin film transistors 30. The pixel electrodes 15 included in the light emitting elements 20 are respectively connected with the thin film transistors 30 via the contact holes 14 provided in the insulating film 13.

As described above, in this embodiment, the first lines 11, the thin film transistors 30 and the light emitting elements 20 are provided on the first substrate 101 and are connected with each other. For example, in the equivalent circuit shown in FIG. 4, the first lines 11 may each act as the power supply line 106a.

A second substrate 202 is bonded to the second surface 101e of the first substrate 101. The second substrate 202 includes the substrate 36 and the second lines 32 provided on the substrate 36. The second lines 32 are connected with the conductive particles 101b via the anisotropic conductive film 34 acting as an adhesive layer. Unlike in the second substrate 201 in embodiment 1, in the second substrate 202 in embodiment 2, only the second lines 32 are provided on the substrate 36. Namely, the second substrate 202 merely acts as a line substrate. It should be noted that elements other than the lines 32 (e.g., passive elements, etc.) may be provided on the substrate 36.

This embodiment provides an effect that the alignment precision of the thin film transistors 30 and the light emitting elements 20 is improved in addition to the effect of embodiment 1. In this embodiment, the thin film transistors 30 and the light emitting elements 20 are provided on the first substrate 101, and therefore, are aligned to each other at a precision realized by photolithography.

Embodiment 3

In embodiment 3, the position of the terminal portion is different from that in embodiment 1. Specifically, in a display device 70 in this embodiment, a second substrate 203 is curved to form a terminal portion. In this embodiment, the difference in the structure from the display device 10 in embodiment 1 will be mainly described, and elements same as those of embodiment 1 will bear the same reference signs and descriptions thereof may be omitted.

Figure 14:
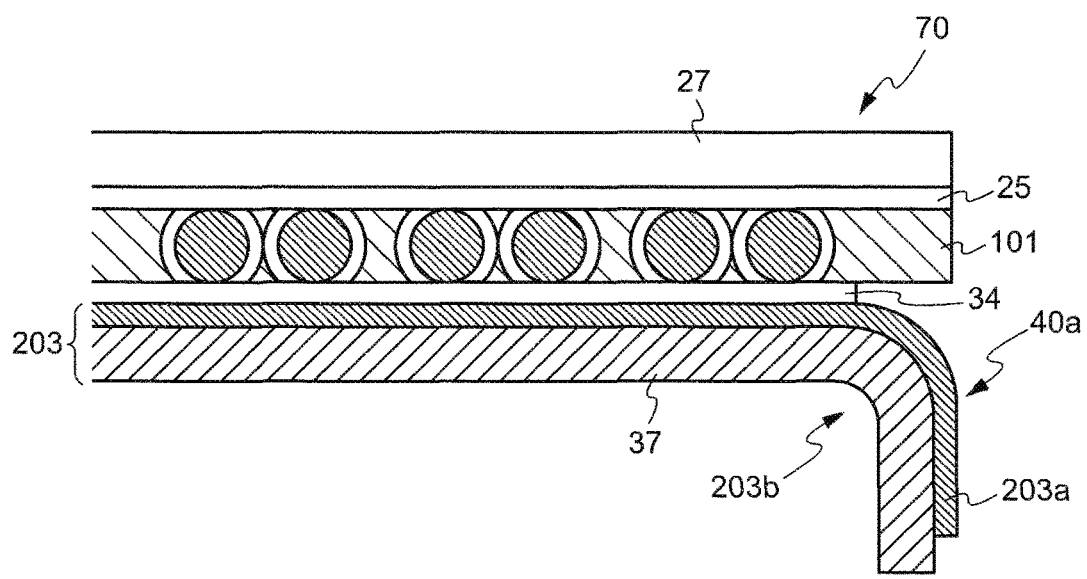
FIG. 14 is a cross-sectional view showing an example of structure of a terminal portion of a display device in embodiment 3.

FIG. 14 is a cross-sectional view showing a structure of a terminal portion 40a of the display device 70 in embodiment 3. In this embodiment, the second substrate 203 includes a substrate 37 and a line 203a. The second substrate 203 includes a curved portion 203b, and an end of the curved portion 203b is directed in a direction away from the first substrate 101 (directed in a downward direction in FIG. 14). Therefore, a portion of the second substrate 203 that is closer to the end than the curved portion 203b is not in contact with the anisotropic film 34 and is exposed outside.

In this embodiment, the substrate 37 needs to be curved, and thus is required to be formed of a flexible material. It is preferable that the substrate 37 is formed of a resin material such as polyimide, polyethyleneterephthalate or the like.

In this embodiment, a portion of the line 203a that is exposed outside is used as the terminal portion 40a. FIG. 14 shows one line 203a, but the terminal portion 40a includes a plurality of the lines 203a as seen in a plan view.

As can be seen, in this embodiment, the connection with an external circuit is provided with certainty by a simple method with no use of the terminal electrode 41 or the connector 43 shown in FIG. 3 in embodiment 1. The substrate 37 does not need to be processed to form a through-hole or the like, but merely needs to be curved. Thus, the method for manufacturing the display device 70 is simplified.

In the above-described embodiments, the present invention is applied to an organic EL display device as an example. The present invention is also applicable to a light emission device other than the organic EL display device (e.g., LED display device), a liquid crystal display device, an electronic paper-type display device including an electrophoretic element or the like, or any other flat panel display device. There is no specific limitation on the size of the elements in the embodiments.

The above-described embodiments may be optionally combined as long as no contradiction occurs. The display devices described above in the embodiments may have an element added thereto, or deleted therefrom, or may be changed in design optionally by a person of ordinary skill in the art. The methods described above in the embodiments may have a step added thereto, or deleted therefrom, or may be changed in the condition optionally by a person of ordinary skill in the art. Such devices and methods are encompassed in the scope of the present invention as long as including the gist of the present invention.

Even functions and effects that are different from those provided by the above-described embodiments but are obvious from the description of this specification or are easily expectable by a person of ordinary skill in the art are naturally construed as being provided by the present invention.

What is claimed is:

1. A display device, comprising:
   a first substrate including a conductive particle provided therein;
   a first line connecting the conductive particle from a side of a first flat surface of the first substrate;
   a display element connecting the first line; and
   a second line connecting the first line via the conductive particle from a side of a second flat surface of the first substrate, wherein
   the conductive particle includes a conductive particle portion and an insulation coating portion surrounding the conductive particle portion,
   a lower part of the conductive particle portion is exposed from the insulation coating portion, and connects the second line via an anisotropic conductive film from the side of the second flat surface of the first substrate, and
   an upper part of the conductive particle portion is exposed from the insulation coating portion, and connects the first line from the side of the first flat surface of the first substrate.

2. The display device according to claim 1, wherein:
   the display element includes a pixel electrode, an electrooptical layer and a common electrode; and
   the first line is connected with the pixel electrode.

3. The display device according to claim 1, wherein the second line is connected with a thin film transistor on the side of the second surface.

4. The display device according to claim 1, wherein the conductive particle is partially covered with a resin.

5. The display device according to claim 1, wherein the first substrate is formed of a resin material.

6. The display device according to claim 1, wherein the conductive particle has a size substantially equal to a thickness of the first substrate.

7. A display device, comprising:
   a first substrate including a conductive particle provided therein;
   a first line connecting the conductive particle from a side of a first flat surface of the first substrate;
   a thin film transistor connecting the first line;
   a display element connecting the thin film transistor; and
   a second line connecting the first line via the conductive particle from a side of a second flat surface of the first substrate, wherein
   the conductive particle includes a conductive particle portion and an insulation coating portion surrounding the conductive particle portion,
   a lower part of the conductive particle portion is exposed from the insulation coating portion, and connects the second line via an anisotropic conductive film from the side of the second flat surface of the first substrate, and
   an upper part of the conductive particle portion is exposed from the insulation coating portion, and connects the first line from the side of the first flat surface of the first substrate.

8. The display device according to claim 7, wherein the conductive particle is partially covered with a resin.

9. The display device according to claim 7, wherein the first substrate is formed of a resin material.

10. The display device according to claim 7, wherein the conductive particle has a size substantially equal to a thickness of the first substrate.

11. A method for manufacturing a display device, comprising:
    applying a resin material containing a conductive particle to a support substrate to form a resin layer;
    etching or polishing the resin film from a first flat surface thereof to partially expose the conductive particle;
    forming a first line connecting the conductive particle from a side of the first flat surface of the resin layer;
    forming a display element connected with the first line;
    peeling off the support substrate from the resin layer;
    etching or polishing the resin layer from a second flat surface thereof to partially expose the conductive particle; and
    bonding a substrate including a second line to the second flat surface of the resin layer to connect the conductive particle and the second line to each other, wherein
    the conductive particle includes a conductive particle portion and an insulation coating portion surrounding the conductive particle portion,
    a lower part of the conductive particle portion is exposed from the insulation coating portion, and connects the second line via an anisotropic conductive film from a side of the second flat surface of the first substrate, and
    an upper part of the conductive particle portion is exposed from the insulation coating portion, and connects the first line from the side of the first flat surface of the first substrate.

12. The method for manufacturing a display device according to claim 11; wherein:
    the display element includes a pixel electrode, an electrooptical layer and a common electrode; and
    the first line is connected with the pixel electrode.

13. The method for manufacturing a display device according to claim 11, wherein the second line is connected with a thin film transistor included in the substrate.

14. The method for manufacturing a display device according to claim 11, wherein the conductive particle is partially covered with a resin.

15. The method for manufacturing a display device according to claim 11, wherein the substrate including the second line and the second flat surface are bonded to each other with the anisotropic conductive film.

* * * * *